(12) United States Patent
Nonomura

(10) Patent No.: US 6,487,673 B1
(45) Date of Patent: Nov. 26, 2002

(54) CLOCK CIRCUIT AND A COMPUTER SYSTEM HAVING SAID CLOCK CIRCUIT

(75) Inventor: Kohichi Nonomura, Shiga-ken (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/348,790

(22) Filed: Jul. 7, 1999

(30) Foreign Application Priority Data

Sep. 10, 1998 (JP) ............................................. 10-256798

(51) Int. Cl.[7] ................................................. G06F 1/12
(52) U.S. Cl. ...................................................... 713/401
(58) Field of Search ................................ 713/400, 401, 713/500, 501, 503, 600

(56) References Cited

U.S. PATENT DOCUMENTS 5,086,500 A * 2/1992 Greub ......................... 713/401
5,293,626 A * 3/1994 Priest et al. .................. 713/401
5,615,358 A * 3/1997 Vogley ......................... 713/501
5,696,951 A * 12/1997 Miller ......................... 713/503
6,003,118 A * 12/1999 Chen ....................... 713/401 X

FOREIGN PATENT DOCUMENTS

JP  4-92910 A   3/1992
JP  07093048 A  4/1995

* cited by examiner

Primary Examiner—Thomas M. Heckler
(74) Attorney, Agent, or Firm—J. Bruce Schelkopf

(57) ABSTRACT

Described is a clock circuit for supplying synchronized signals to a plurality of circuits. The clock circuit includes a clock generator and a driver for outputting the clock signals inputted from the clock generator with a delay time so that a difference among arrival times of the clock signals is minimized among the plurality of circuits.

11 Claims, 2 Drawing Sheets

CLOCK CIRCUIT AND A COMPUTER SYSTEM HAVING SAID CLOCK CIRCUIT

BACKGROUND OF THE INVENTION

1. Field of the Invention

The present invention relates to a clock circuit for supplying clock signals in synchronization with a plurality of circuits, more particularly to a clock circuit which is capable of minimizing an arrival time difference of synchronized clock signals among a plurality of circuits in a system such as a computer system.

2. Description of Related Art

In a system having a plurality of circuits such as a computer system, circuits constituting the system are driven by clock signals in synchronization with each other. These synchronized clock signals are ordinarily generated by a clock generator and supplied to each of the circuits.

In the computer system, with the advance of operation speeds of microprocessors (CPU) circuits, such as a memory, have been able to operate at high speed. Furthermore, the development of functions of the system increases the number of circuits which constitute the system. Under such circumstances, a clock generator which can generate plural frequencies and supply the same frequency to a plurality of circuits has been put into practice.

FIG. 1 is a block diagram showing an example of a computer system which uses a conventional clock generator. In the system shown in FIG. 1, clock signals generated by the clock generator 1 are supplied to the four circuits including the CPU 2, the memory controller 3, the base SDRAM 4 used as an already incorporated memory, and the optional SDRAM 5 used as an additionally incorporated memory, which constitute the system.

In such a system, since the distances between the clock generator and each circuit are different, delay times of the clock signals are made to be different from each other among the circuits due to wiring impedance. As a result, a so called "skew" occurs in which the arrival times of the clock signal to each of the circuits are different from each other. More specifically, as a speed of the clock signals becomes higher, the cloak skew becomes more significant. In order to avoid this problem, the system of FIG. 1 is designed such that the arrival times of the clock signals are equal among the circuits by providing the dummy wiring 6 to adjust the lengths of the wiring from the clock generator to the circuits.

However, when the dummy wiring 6 is employed, the system of FIG. 1 gives rise to two problems. First, there is a need for an excessive space on the board to form the dummy wiring. Second, the dummy wiring causes the occurrence of EMI and crosstalk noises.

OBJECTS OF THE INVENTION

An object of the present invention is to provide a circuit for supplying clock signals and minimizing the difference among arrival times of the clock signals to a plurality of circuits.

Another object of the present invention is to reduce the amount of wiring in the circuit board in which a plurality of circuits are formed, thereby reducing the occurrence of EMI and crosstalk noises.

Still another object of the present invention is to provide a method for supplying clock signals which are capable of minimizing the difference among arrival times of the clock signals to a plurality of circuits.

Moreover, still another object of the present invention is to provide a computer system which is capable of minimizing the difference among arrival times of clock signals to a plurality of circuits and reducing the occurrence of EMI and crosstalk noises.

SUMMARY OF THE INVENTION

The present invention is directed to a clock circuit which supplies clock signals synchronized with each other to a plurality of circuits. The clock circuit includes a clock generator and a driver for outputting each of the clock signals supplied from the clock generator. Each signal being output with a delay from other signals to corresponding one of the plurality of circuits so that a difference of arrival times of clock signals is minimized among the plurality of circuits.

Another embodiment of the present invention is directed to a computer system which includes a CPU, a memory controller, a memory and a clock circuit for supplying clock signals in synchronization with each other. The clock circuit outputs the clock signals by delaying them for each of the plurality of circuits so that a difference among arrival times of the clock signals to the plurality of circuits is minimized.

Another embodiment of the present invention is directed to a method for supplying clock signals synchronized with each other to a plurality of circuits. The method includes the steps of setting delay times of the clock signals for corresponding one of the circuits and outputting the clock signals with a delay time predetermined for each circuit so that a difference among the arrival times of the clock signals to a plurality of circuits is minimized.

DETAILED DESCRIPTION OF THE INVENTION

Figure 1:
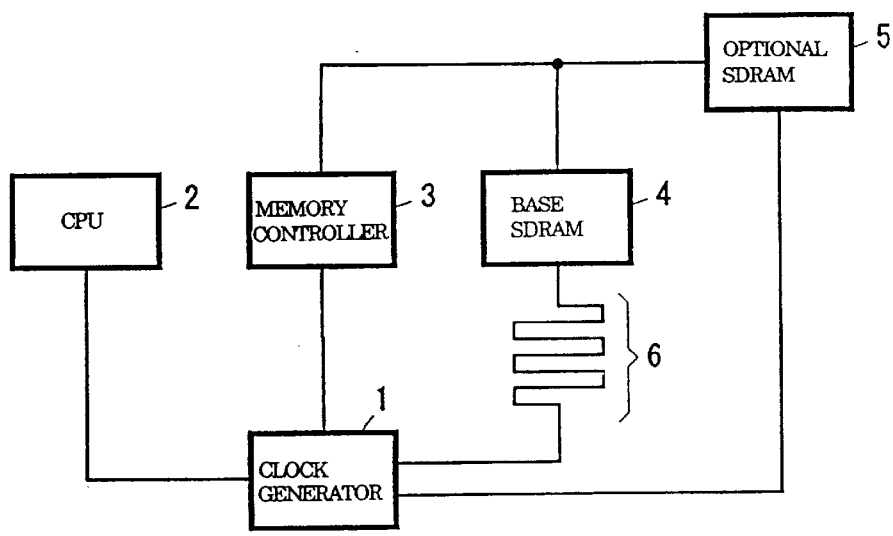
FIG. 1 is a block diagram showing an example of a conventional computer system.
Figure 2:
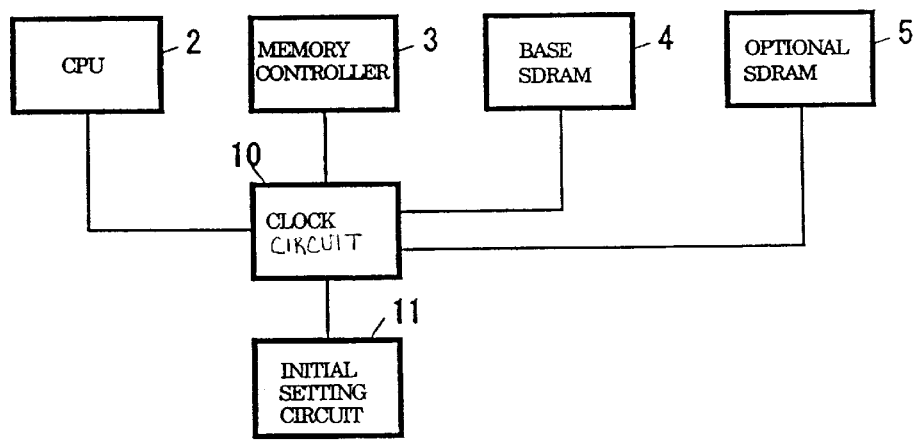
FIG. 2 is a block diagram showing a computer system according to the present invention.

FIG. 2 is a block diagram showing a computer system which uses a clock circuit of the present invention. Referring to FIG. 2, the four circuits including the CPU 2, the memory controller 3, the base SDRAM 4 used as an already incorporated memory, and an optional SDRAM 5 used as an additionally incorporated memory are the same as those of the conventional example of FIG. 1. Newly added components are the clock circuit 10 and the initial setting circuit 11. Furthermore, in this system, a dummy wiring like that of the conventional example of FIG. 1 is unnecessary.

The clock circuit 10 outputs the clock signals with a delay time for each of the four circuits including the CPU 2, the memory controller 3, the base SDRAM 4 and the SDRAM 5 so that the arrival time difference of the clock signals supplied to the four circuits is minimized among the four circuits. The initial setting circuit 11 controls the clock circuit 10 so that the clock circuit 10 selects a delay time suitable for a load state of any of the four circuits connected to the clock circuit.

Figure 3:
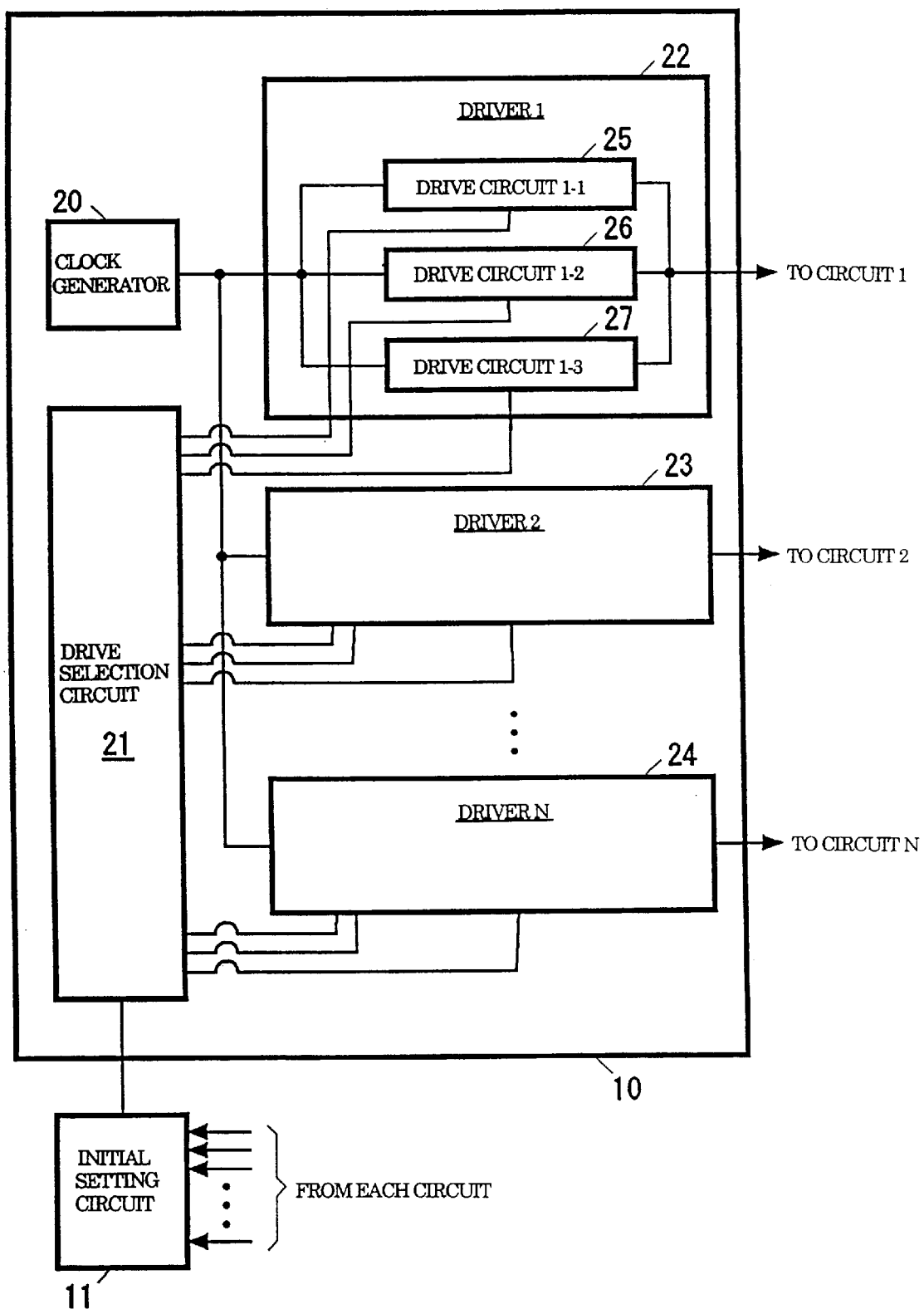
FIG. 3 is a block diagram showing a clock circuit according to the present invention.

FIG. 3 is a block diagram showing the detail of the clock circuit 10 of the present invention. The clock circuit 10 includes the clock generator 20, the drive selection circuit 21 and the drivers (1-N) denoted by reference numerals 22, 23 and 24. The number of drivers are changed according to the number of circuits which are supplied with the clock signals. Each of the drivers has a plurality of drive circuits. In FIG. 3, the driver 1 has three drive circuits (1-1), (1-2) and (1-3). The driver 2 and the driver N also have a plurality of drive circuits, similar to the driver 1. It should be noted that the number of drive circuits is changed depending on the state of the circuits supplied with the clock signals.

Figure 4:
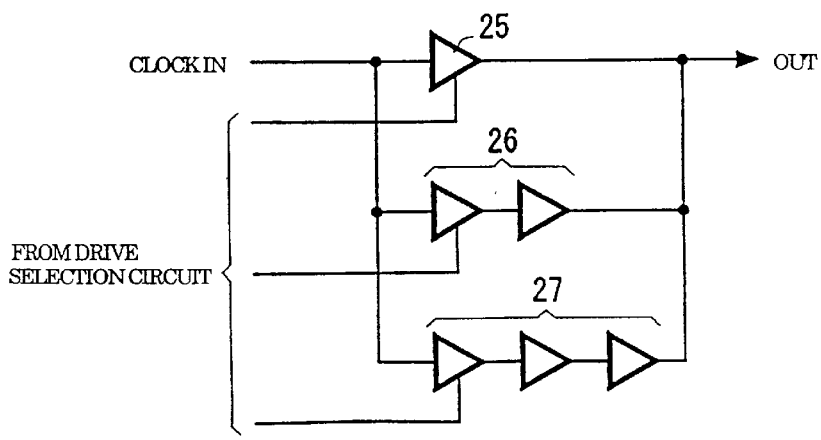
FIG. 4 is a diagram showing a detail of a driver according to the present invention.

FIG. 4 is a diagram showing the detail of an embodiment of the driver 1. Each of the drive circuits 25, 26 and 27 is composed of inverters. Each of the inverters receives the clock signal and outputs it with a predetermined delay time. The delay time is previously set depending on the load state (wiring impedance and the like) of the circuits supplied with the clock signals. The delay time is adjusted according to the number of inverters. For example, the drive circuit 27 having three inverters presents the delay time three times as long as that of the drive circuit 25 having one inverter. The signal line from the drive selection circuit 21 is connected to the inverter of the first stage of each of the driver circuits. An enable signal or a disable signal for turning on/off these inverters is sent to these inverters through the signal line.

The clock generator 20 generates the clock signals in synchronization with each other, which are necessary for the circuits. The frequencies and cycles of the clock signals can be freely varied. It should be noted that the clock signals may be supplied from an external clock generator other than the clock generator 20. The drive selection circuit 21 has a function to select the drive circuit in the driver depending on which circuit the clock circuits are supplied to, under the control of the initial setting circuit 11. The initial setting circuit 11 has a function to detect the circuit to which the clock signals are supplied and send the selection signal to the driver, which is for selecting the drive circuit corresponding to the detected circuit.

The initial setting circuit 11 consists of, for example, a BIOS memory, in which information relating to the load state of the circuit to which the clock signals are supplied is previously stored. Furthermore, the initial setting circuit 11 has a table which makes the information relating to the load state of the circuit correspond with the delay time of the clock signal. The initial setting circuit 11 reads out from the table ID information from the circuit connected thereto and selects the delay time of the clock signal corresponding to the information relating to the load state of the circuit. Thereafter, the initial setting circuit outputs the signal for selecting the drive circuit to the drive selection circuit 21, the signal having the selected delay time.

An operation of the clock circuit 10 of FIG. 3 when the driver 1 is used will be described. The drivers 2 and N also operate similarly to the driver 1. At the time of starting the system, the clock generator 20 generates the clock signals of a low frequency which have less influence on the system even when a signal delay occurs due to wiring impedance between the circuits and the clock generator 20. At this time, the initial setting circuit 11 sends the selection signal to the drive selection circuit 21 so that the driver 1 does not select any of the drive circuits. The drive selection circuit 21 sends the disable signal to the three drive circuits (inverters) 25 to 27 of the driver 1 based on the selection signal. Thus, the clock signals of the low frequency which were input to the driver 1 from the clock generator 20 remain are not delayed and are output to the circuit 1.

The initial setting circuit 11 detects the connection of the circuit 1 by reading out the ID of circuit 1 when the low frequency clock signals are being supplied to the circuit 1. Then, the initial setting circuit 11 makes the load state of the circuit 1 correspond with the delay time corresponding thereto using the table. The initial setting circuit 11 sends the selection signal for selecting the drive circuit having the selected delay time to the drive selection circuit 21. For example, the initial setting circuit 11 sends address information of the drive circuit (1-1) as the selection signal A. At this time, the selected drive circuit changes depending on a load state of the circuit 1. The driver selection circuit 21 sends the disable signal to the two driver circuits (1-2) and (1-3) other than the drive circuit (1-1) based on the selection signal A. Thus, it follows that an output of the drive 1 is the output of the drive circuit (1-1).

After the drive circuit (1-1) is selected, the clock generator 20 generates the clock signals of a normal high frequency for driving the system instead of the clock signals of the low frequency. The normal clock signals input to the drive circuit (1-1) are output from the driver 1 after they were delayed by the predetermined delay time. As a result, the synchronized clock signals which have been delayed by the delay times suitable for the circuits are supplied. It should be noted that when any one of the optional SDRAMs is not connected, the initial setting circuit 11 sends a signal for stopping the output of the driver corresponding to the drive selection circuit. At this time, the drive selection circuit sends the disable signal to all of the driver circuits in the driver. The similar operation is executed for the drivers 1 and N. The clock output of the drive circuit is selected depending on the circuit which is output from each of the drivers.

As described above, the clock circuit of the present invention can output the clock signal to the circuit after suitably delaying the clock signal depending on the load state of the circuit. Therefore, it is possible to prevent the occurrence of a "skew". Since the amount of the wiring on the circuit board can be reduced, it is possible to reduce the occurrence of EMI and crosstalk noises. Furthermore, an excessive space on the board for detouring the wiring becomes unnecessary.

While the invention has been particularly shown and described with respect to preferred embodiments thereof, it should be understood by those skilled in the art that the foregoing and other changes in form and detail may be made therein without departing from the spirit and scope of the invention as defined in the appended claims.

What is claimed:

1. A clock circuit which supplies clock signals synchronized with each other to a plurality of circuits, comprising:
    a clock generator; and
    a driver for outputting each clock signal supplied from clock generator, each signal being outputted with a delay from other signals to corresponding one of said plurality of circuits so that a difference among arrival times of said clock signals is minimized among said plurality of circuits, wherein
        said driver has a plurality of delay times previously determined depending on a load state of each of said circuits, and selects the delay time for each of said circuits supplied with the clock signals, thereby outputting the clock signal after delaying it by the delay time.

2. The circuit according to claim 1, wherein said clock circuit further includes a driver selection circuit for selecting the drive circuit corresponding to one of the plurality of circuits and a delayed clock signal from the drive circuit selected by the driver selection circuit is supplied to the corresponding circuit.

3. The circuit according to claim 2, further including an initial setting circuit which determines the circuit supplied with the clock signal, and outputs a selection signal for selecting the drive circuit which has the delay time corresponding to the load state of the circuit detected to the driver selection circuit.

4. The circuit according to claim 3, wherein said initial setting circuit decides the load state of the circuit and outputs the selection signal for selecting the drive circuit which has the delay time corresponding to the decided load state of the circuit to the driver selection circuit, thereby switching the output of the drive circuit to a delayed clock output of the selected drive circuit when a low frequency clock signal is supplied to the circuits at the time of starting the plurality of circuits.

5. A computer system comprising:

a CPU;

a memory controller;

a memory; and a clock circuit for supplying clock signals in synchronization with each other, the clock circuit further comprising:

a clock generator; and a driver for receiving clock signals supplied from the clock generator and outputting one or more clock signals with a delay time predetermined in accordance with each circuit of the CPU, the memory controller and the memory to be supplied with the clock signal such that a difference of arrival times of the clock signals among the CPU, the memory controller and the memory is minimized.

6. The computer system according to claim 5, wherein the memory includes an already incorporated memory and an additionally incorporated memory added according to demand.

7. The computer system according to claim 5, further including:

a drive selection circuit for selecting a corresponding drive circuits, a delayed clock output is supplied from the drive circuit selected by the drive selection circuit, and wherein the driver is composed of a plurality of drive circuits, each of the driver circuits has a delay time predetermined in accordance with the load state of the circuit supplied with the clock signal.

8. The computer system according to claim 7, further including an initial setting circuit for deciding the circuit to be supplied with the clock signal, and a selection signal for selecting the drive circuit having the delay time in accordance with the detected circuit is outputted to the drive selection circuit.

9. The computer system according to claim 8, wherein the initial setting circuit decides the load state of the circuit and outputs the selection signal for selecting the drive circuit having the delay time in accordance with the decided load state of the circuit when a low frequency clock signal is supplied to the circuit at the time of starting the plurality of circuits, thereby changing the output of the drive circuit to a delay clock output of the drive circuit.

10. A method for supplying clock signals in synchronization with each other to a plurality of circuits, comprising the steps of: setting a delay time of the clock signals for each circuit of the plurality of circuits, wherein the delay time of the clock signal is set in accordance with a load state of the circuit to be supplied with the clock signal; and outputting the clock signals with the delay time determined for each circuit so that a difference of arrival times of said clock signal is minimized among the plurality of circuits.

11. The method according to claim 10, wherein the step for outputting said clock signal with the delay time includes:

supplying a low frequency clock signal to the circuit at the time of starting the plurality of circuits;

deciding the load state of the circuit and selecting the delay time predetermined in accordance with the decided load state of the circuit; and supplying a normal clock signal which is delayed by the selected delay time instead of the low frequency clock signal.

* * * * *